(12) United States Patent
Okada et al.

(10) Patent No.: US 9,207,257 B2
(45) Date of Patent: Dec. 8, 2015

(54) INSPECTION APPARATUS

(71) Applicants: Akira Okada, Tokyo (JP); Hajime Akiyama, Tokyo (JP); Kinya Yamashita, Tokyo (JP)

(72) Inventors: Akira Okada, Tokyo (JP); Hajime Akiyama, Tokyo (JP); Kinya Yamashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 84 days.

(21) Appl. No.: 13/784,727

(22) Filed: Mar. 4, 2013

(65) Prior Publication Data

US 2014/0015554 A1 Jan. 16, 2014

(30) Foreign Application Priority Data

Jul. 10, 2012 (JP) .................. 2012-154699

(51) Int. Cl.
  *G01R 31/00* (2006.01)
  *G01R 1/067* (2006.01)
  *G01R 1/44* (2006.01)
  *G01R 3/00* (2006.01)
  *G01R 1/04* (2006.01)

(52) U.S. Cl.
  CPC .......... *G01R 1/0408* (2013.01); *G01R 1/06705* (2013.01); *G01R 1/44* (2013.01); *G01R 3/00* (2013.01)

(58) Field of Classification Search
  CPC ...... G01R 1/067; G01R 1/0408; G01R 1/073; G01R 31/2601; G01R 31/2855; G01R 31/2886; G01R 31/2875; G01R 31/2876; G01R 1/06705; G01R 1/44; G01R 3/00

USPC .................. 324/750.01, 750.03, 754, 756.03, 324/756.07
  See application file for complete search history.

(56) References Cited

U.S. PATENT DOCUMENTS

| | | | | |
|---|---|---|---|---|
| 4,659,987 A | * | 4/1987 | Coe et al. ................. | 324/755.05 |
| 5,623,214 A | * | 4/1997 | Pasiecznik, Jr. ......... | 324/755.09 |
| 2003/0160624 A1 | | 8/2003 | Takemoto et al. | |
| 2005/0184745 A1 | * | 8/2005 | Machida et al. ............... | 324/754 |
| 2008/0042668 A1 | * | 2/2008 | Eldridge et al. ............... | 324/754 |
| 2008/0106293 A1 | * | 5/2008 | Hashimoto .................... | 324/760 |
| 2011/0050266 A1 | * | 3/2011 | Sasaki et al. ............. | 324/756.03 |
| 2011/0241711 A1 | | 10/2011 | Teich et al. | |
| 2011/0254575 A1 | * | 10/2011 | Uesaka et al. ........... | 324/754.11 |
| 2013/0321019 A1 | * | 12/2013 | Okada et al. ............. | 324/756.03 |

FOREIGN PATENT DOCUMENTS

JP 60-079740 U 6/1985

(Continued)

OTHER PUBLICATIONS

Uenishi Takao (Inventor). Tokyo Electron LTD (Assignee). JP 7066252 A. (Published Mar. 10, 1995). [English Machine Translation].*

(Continued)

*Primary Examiner* — Melissa Koval
*Assistant Examiner* — Felicia Farrow
(74) *Attorney, Agent, or Firm* — Studebaker & Brackett PC

(57) ABSTRACT

An inspection apparatus includes an insulating substrate, a socket in which a body portion having a through-hole in a wall thereof is integrally formed with a connection portion secured to the insulating substrate, and a contact probe detachably secured to the socket.

16 Claims, 8 Drawing Sheets

(56) References Cited

FOREIGN PATENT DOCUMENTS

| | | | |
|---|---|---|---|
| JP | S63-63772 U | | 4/1988 |
| JP | H06-94750 A | | 4/1994 |
| JP | 07-066252 A | | 3/1995 |
| JP | 7066252 A | * | 3/1995 |
| JP | 07-169802 A | | 7/1995 |
| JP | H07-321168 A | | 12/1995 |
| JP | 2001-153886 A | | 6/2001 |
| JP | 2010-164490 A | | 7/2010 |
| JP | 2011-228324 A | | 11/2011 |
| JP | 2012-503304 A | | 2/2012 |
| JP | 2012-047503 A | | 3/2012 |
| WO | 2010/028914 A1 | | 3/2010 |

OTHER PUBLICATIONS

Uenishi Takao (Inventor). Tokyo Electron LTD (Assignee). JP 7066252A (Published Mar. 10, 1995). (English Machine Translation).*

The First Office Action issued by the Chinese Patent Office on Jul. 21, 2015, which corresponds to Chinese Patent Application No. 201310232807.3 and is related to U.S. Appl. No. 13/784,727; with English language partial translation.

An Office Action; "Notice of Reasons for Rejection," issued by the Japanese Patent Office on Sep. 29, 2015, which corresponds to Japanese Patent Application No. 2012-154699 and is related to U.S. Appl. No. 13/784,727; with English language partial translation.

* cited by examiner

INSPECTION APPARATUS

BACKGROUND OF THE INVENTION

1. Field of the Invention

The present invention relates to an inspection apparatus used for inspecting the electrical characteristics of an object to be measured.

2. Background Art

It is known practice to inspect the electrical characteristics of a heated object to be measured by bringing a contact probe into contact with the object. The contact probe is typically secured to an insulating substrate. Japanese Laid-Open Patent Publication No. 2012-47503 discloses a technique for varying the temperature of a probe substrate (or insulating substrate) in accordance with changes in the temperature of the object to be measured. This technique directly heats the insulating substrate to the desired temperature. Published Japanese Translation of PCT Application No. 2012-503304 discloses a technique for supplying a temperature-controlled gas flow to within an inspection apparatus so as to regulate the temperature of the insulating substrate to the desired temperature.

The technique disclosed in the above Patent Publication No. 2012-47503 is disadvantageous in that the insulating substrate may expand or warp due to the heat applied to the substrate. The expansion or warpage of the insulating substrate results in displacement of the contact probe attached to the insulating substrate, making it impossible to bring the contact probe into contact with the desired point on the object to be measured and press the contact probe against the object with the desired pressure. Further, heat is transferred from the heated object to be measured to the insulating substrate through the contact probe, thereby causing the insulating substrate to expand or warp.

The technique disclosed in the above Published Japanese Translation of PCT Application No. 2012-503304, on the other hand, can be used to maintain the insulating substrate at, e.g., approximately room temperature. However, a complicated apparatus and considerable electric energy are required to supply a temperature-controlled gas flow.

SUMMARY OF THE INVENTION

The present invention has been made to solve the above problems. It is, therefore, an object of the present invention to provide an inspection apparatus which prevents the expansion and warpage of the insulating substrate by using a simple method.

The features and advantages of the present invention may be summarized as follows.

According to one aspect of the present invention, an inspection apparatus includes an insulating substrate, a socket in which a body portion having a through-hole in a wall thereof is integrally formed with a connection portion secured to the insulating substrate, and a contact probe detachably secured to the socket.

According to another aspect of the present invention, an inspection apparatus includes an insulating substrate having at least one air blow through-hole formed therein, a socket secured to a lower surface of the insulating substrate, a contact probe detachably secured to the socket, and a blower disposed on the upper side of the insulating substrate and adapted to blow air onto the socket and the contact probe through the at least one air blow through-hole.

Other and further objects, features and advantages of the invention will appear more fully from the following description.

DETAILED DESCRIPTION OF THE PREFERRED EMBODIMENTS

First Embodiment

Figure 1:
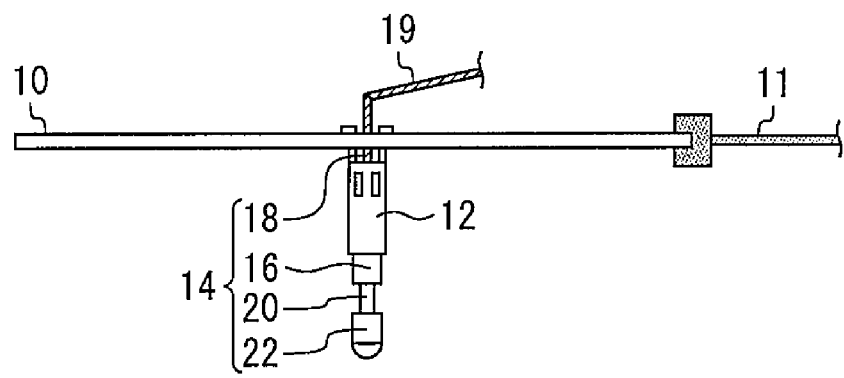
FIG. 1 is a diagram showing an inspection apparatus in accordance with a first embodiment of the present invention.

FIG. 1 is a diagram showing an inspection apparatus in accordance with a first embodiment of the present invention. The inspection apparatus of the first embodiment includes an insulating substrate 10. The insulating substrate 10 is preferably formed of a low thermal expansion material, e.g. ceramic material. The insulating substrate 10 can be moved in any direction by use of an arm 11. A socket 12 is secured to the insulating substrate 10. The socket 12 is preferably formed of high heat-radiating material such as aluminum or copper.

A contact probe 14 is detachably secured to the socket 12. The contact probe 14 is formed of conductive metal material such as, e.g., copper, tungsten, or rhenium tungsten. The contact probe 14 has a mounting portion 16, one end of which is inserted into the socket 12. An electrically conductive portion 18 is connected to the same end of the mounting portion 16 inserted into the socket 12. The electrically conductive portion 18 is used to electrically connect the contact probe 14 and an external device. The electrically conductive portion 18 is connected to a signal line 19 which in turn is connected to the external device.

A pushing portion 20 is connected to the other end of the mounting portion 16. The pushing portion 20 has a spring, etc. therein and can be extended and retracted in the axial direction. A tip portion 22 having a rounded shape is connected to the pushing portion 20. The tip portion 22 is brought into contact with the object to be measured. The tip portion 22 is preferably coated, e.g., with gold, palladium, tantalum, or platinum in order to enhance its conductivity and durability.

Figure 2:
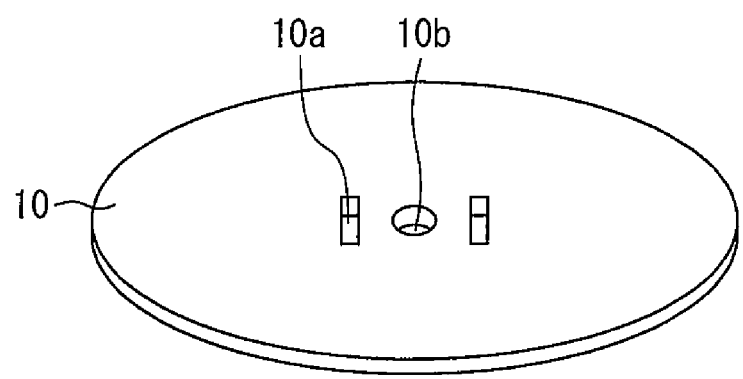
FIG. 2 is a perspective view of the insulating substrate.

FIG. 2 is a perspective view of the insulating substrate. The insulating substrate 10 has securing through-holes 10a formed therein. The securing through-holes 10a are designed to receive a portion of the socket 12 therethrough. The insulating substrate 10 also has formed therein a through-hole 10b which is sandwiched between the securing through-holes 10a. The through-hole 10b is designed to receive the electrically conductive portion 18 therethrough.

Figure 3:
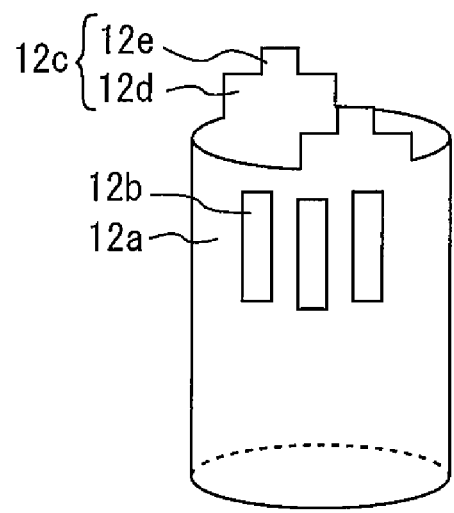
FIG. 3 is a perspective view of the socket.

FIG. 3 is a perspective view of the socket. The socket 12 has a body portion 12a having a plurality of through-holes 12b formed in its wall. The socket 12 also has connection portions 12c formed integrally with the body portion 12a. The connection portions 12c are secured to the insulating substrate 10. Each connection portion 12c has a wide part 12d and a narrow part 12e.

Figure 4:
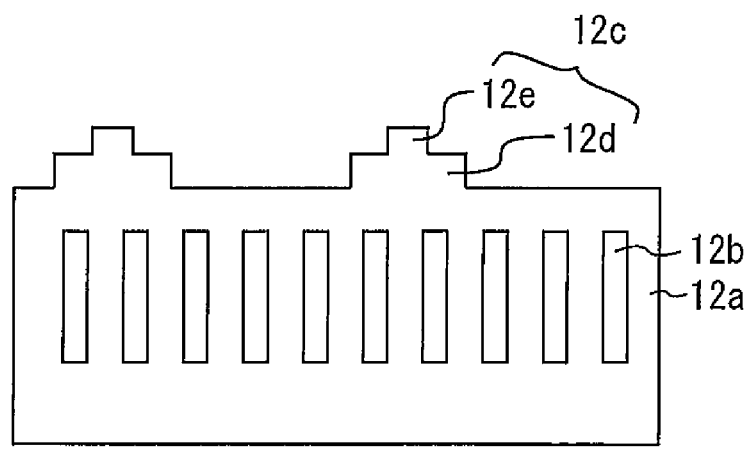
FIG. 4 is an unrolled view of the socket, which has a cylindrical shape.

FIG. 4 is an unrolled view of the socket, which has a cylindrical shape. The socket is formed by cutting, bending, etc. a single piece of metal plate material. Specifically, a metal plate is punched by press, etc. so as to form the through-holes 12b of the body portion 12a. The wide part 12d and the narrow part 12e of each connection portion 12c are then formed in the same manner as the through-hoes 12b, producing the plate shown in FIG. 4. This plate is then rolled into a cylinder, thus completing the formation of the socket 12. It should be noted that the plate shown in FIG. 4 may be rolled into a tapered cylinder in order to minimize the possibility of the connection portions 12c falling out of the securing through-holes 10a of the insulating substrate 10 after they are secured into these through-holes 10a.

Figure 5:
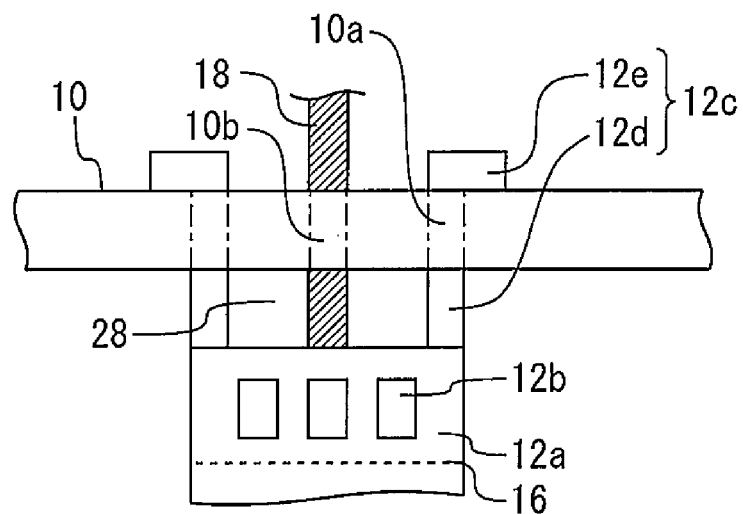
FIG. 5 is an enlarged view showing the connection portions of the socket and their neighboring components.

FIG. 5 is an enlarged view showing the connection portions of the socket and their neighboring components. The connection portions 12c are secured to the insulating substrate 10 by inserting the narrow parts 12e through the securing through-holes 10a of the insulating substrate 10 and then bending the narrow parts 12e. The narrow parts 12e are secured to the insulating substrate 10 by means of, e.g., solder. The wide parts 12d function as spacers for spacing the body portion 12a and the insulating substrate 10 a predetermined distance apart from each other. As a result, the connection portions 12c are secured to the insulating substrate 10 with an air gap 28 defined between the body portion 12a and the insulating substrate 10.

It should be noted that in FIG. 5 the top surface of the mounting portion of the contact probe is indicated by a dashed line. Since the top surface of the mounting portion is located below the through-holes 12b of the socket 12, the mounting portion is exposed to ambient atmosphere through the through-holes 12b and the air gap 28.

Figure 6:
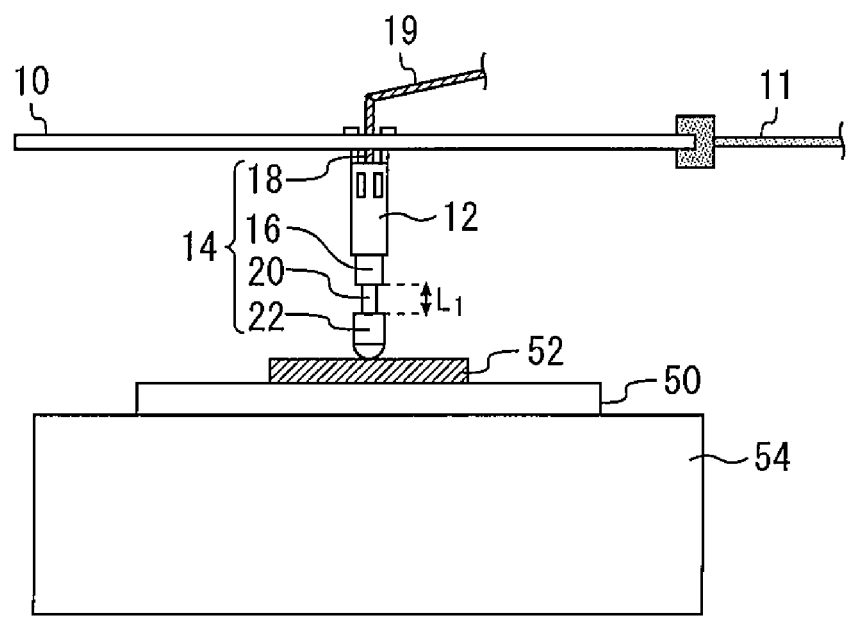
FIG. 6 is a diagram showing the inspection apparatus when the tip portion of the contact probe has been brought into contact with a pad of a semiconductor device.

A method of using the inspection apparatus of the first embodiment will now be described. FIG. 6 is a diagram showing the inspection apparatus when the tip portion of the contact probe has been brought into contact with a pad of a semiconductor device. The semiconductor device 50 is, e.g., a wafer having a plurality of IGBT chips formed therein. Therefore, the pad, 52, of the semiconductor device 50 is relatively large, since a high current is applied to the semiconductor device 50. The semiconductor device 50 is held onto a stage 54 by means of, e.g., suction or electrostatic force. The stage 54 incorporates a heating element for heating the semiconductor device 50.

First, the insulating substrate 10 is moved by means of the arm 11 so that the tip portion 22 is brought into contact with the pad 52 of the semiconductor device 50. In FIG. 6, reference numeral L1 denotes the length of the pushing portion 20 projecting from the mounting portion 16 when the tip portion 22 just reaches the pad 52 of the semiconductor device 50. The arm 11 is then moved further downward to press the tip portion 22 against the pad 52.

Figure 7:
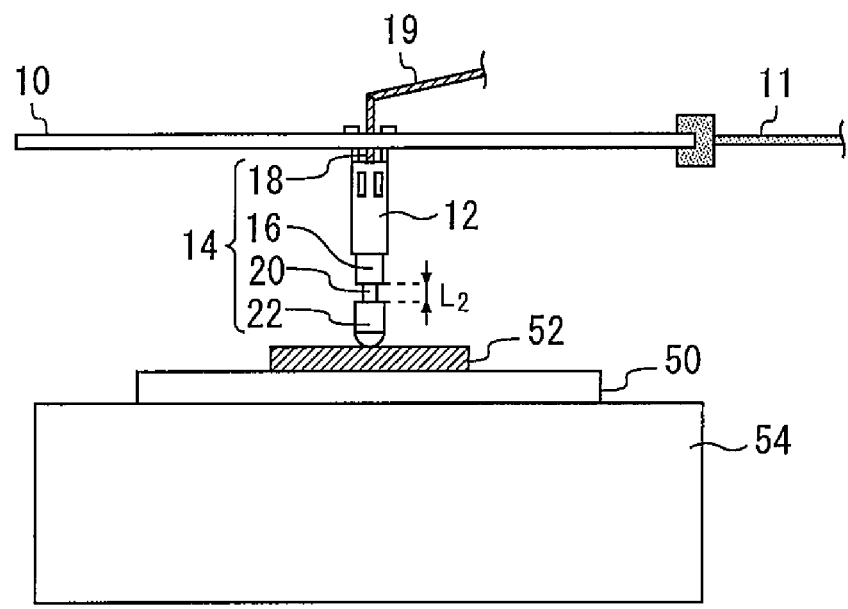
FIG. 7 is a diagram showing the inspection apparatus when the tip portion is pressed against the pad.

FIG. 7 is a diagram showing the inspection apparatus when the tip portion is pressed against the pad. The length of the pushing portion 20 projecting from the mounting portion 16 in this state is indicated by L2 in FIG. 7 and is shorter than the length L1. In this state, the spring of the pushing portion 20 functions to press the tip portion 22 against the pad 52 with adequate pressure. The electrical characteristics of the semiconductor device 50 are then measured by use of an external measuring device connected to the signal line 19, while pressing the tip portion 22 against the pad 52 in the manner described above. This measurement is accomplished by applying a high current, e.g., a few hundreds of amperes of current, to the semiconductor device 50 while heating the semiconductor device 50 by means of the heating element incorporated in the stage 54.

When the electrical characteristics of a heated semiconductor device are measured by use of an inspection apparatus such as that of the first embodiment, heat may flow from the heated semiconductor device to the insulating substrate 10 through the contact probe 14 and the socket 12. In the inspection apparatus of the first embodiment, however, the through-holes 12b are formed in the socket 12, and the air gap 28 is formed between the body portion 12a of the socket 12 and the insulating substrate 10. Further, the mounting portion 16 is exposed to ambient atmosphere through the through-holes 12b and the air gap 28. This configuration enhances the heat dissipation from the socket 12 and the contact probe 14 and thereby minimizes the heating of the insulating substrate 10, making it possible to prevent the insulating substrate 10 from being heated to a high temperature and subjected to expansion or warpage.

Since in the first embodiment the tip portion 22 of the contact probe 14 is formed to have a rounded shape, the current density in the tip portion 22 can be reduced, as compared with cases in which the tip portion 22 is pointed. This prevents the tip portion 22, the pad 52, and the semiconductor device 50 from being heated to a high temperature, which would otherwise result in degradation of the semiconductor device 50. As a result, it is possible to increase the yield of the semiconductor device 50.

Figure 8:
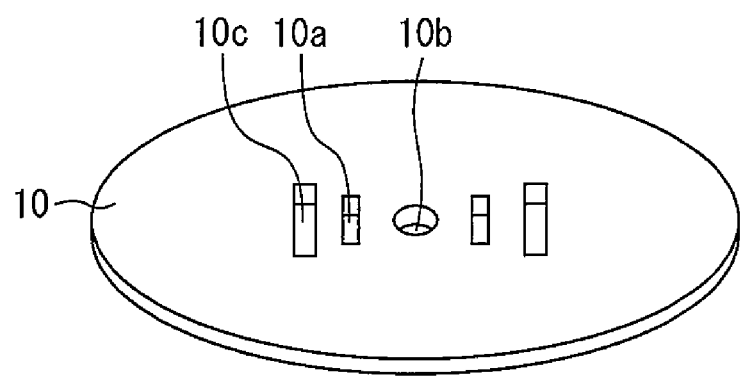
FIG. 8 is a perspective view of an insulating substrate having heat dissipation through-holes formed therein.

Although in the first embodiment the through-holes 12b are formed in the socket 12 and the air gap 28 is formed between the body portion 12a of the socket 12 and the insulating substrate 10, it is to be understood that it is possible to prevent the insulating substrate 10 from being heated to a high temperature without either the through-holes 12b or the air gap 28. It should be noted that the insulating substrate 10 may be provided with heat dissipation through-holes in order to enhance the heat dissipation from the insulating substrate 10. FIG. 8 is a perspective view of an insulating substrate having heat dissipation through-holes formed therein. The heat dissipation through-holes 10c serve to enhance the heat dissipation from the insulating substrate 10.

Although in the first embodiment only one contact probe is connected to the insulating substrate, it is to be understood that a plurality of contact probes may be connected to the insulating substrate. In certain cases particularly where a high current is applied to a semiconductor device to measure its electrical characteristics, it is preferable to use a plurality of contact probes.

Second Embodiment

Figure 9:
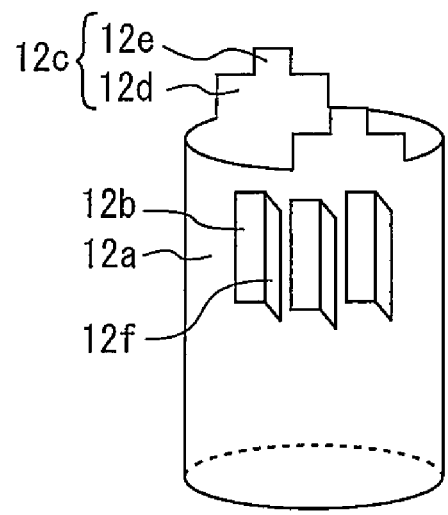
FIG. 9 is a perspective view of a socket of the second embodiment.
Figure 10:
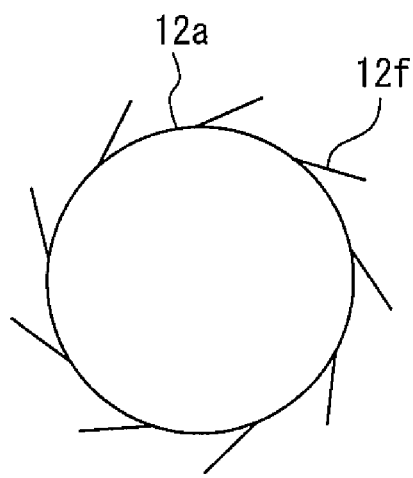
FIG. 10 is a plan view of the socket of the second embodiment.

A second embodiment of the present invention provides an inspection apparatus which has many features common to the inspection apparatus of the first embodiment. Therefore, the following description of the second embodiment will be primarily limited to the difference from the first embodiment. FIG. 9 is a perspective view of a socket of the second embodiment. FIG. 10 is a plan view of the socket of the second embodiment.

The socket is provided with radiating fins 12f. These radiating fins 12f are formed by bending portions of the socket. Specifically, the through-holes 12b are formed by cutting flaps in the socket and then bending (or raising) them, and these bent flaps serve as radiating fins. In this way, the radiating fins 12f can be easily formed without additional material. These radiating fins 12f enhance the heat dissipation from the socket.

Figure 11:
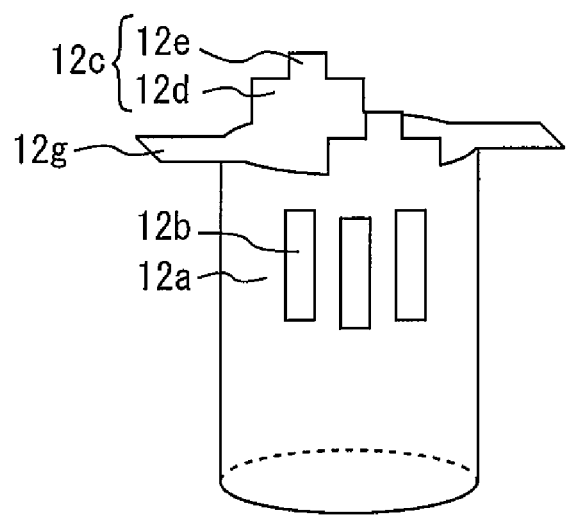
FIG. 11 is a perspective view of a variation of the socket of the second embodiment.
Figure 12:
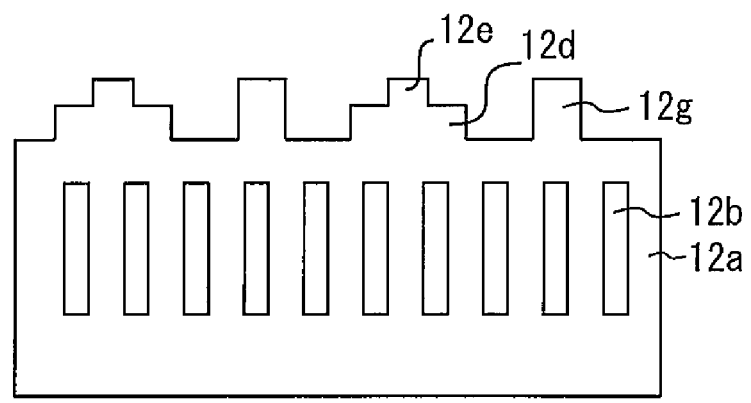
FIG. 12 is an unrolled view of the socket shown in FIG. 11.

The radiating fins 12f may be formed at any suitable positions. FIG. 11 is a perspective view of a variation of the socket of the second embodiment. This socket has radiating fins 12g provided at the top end of its body portion 12a. FIG. 12 is an unrolled view of the socket shown in FIG. 11.

Third Embodiment

Figure 13:
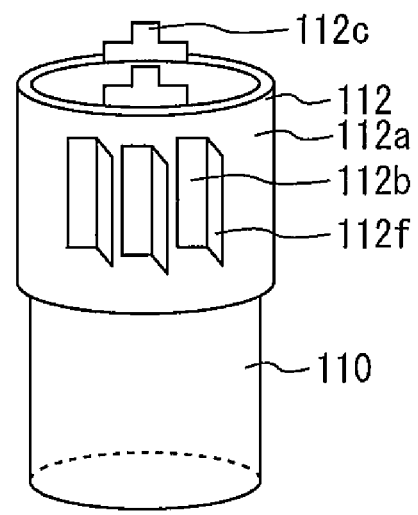
FIG. 13 is a perspective view of a socket of the third embodiment.

A third embodiment of the present invention provides an inspection apparatus which has many features common to the inspection apparatus of the first embodiment. Therefore, the following description of the third embodiment will be primarily limited to the differences from the first embodiment. FIG. 13 is a perspective view of a socket of the third embodiment.

This socket is provided with a socket base 110. The socket base 110 is a general-purpose cylindrical socket available in the market. A mounting member 112 is secured to the socket base 110. The mounting member 112 has a body portion 112a and connection portions 112c. Through-holes 112b are formed in the wall of the body portion 112a, and radiating fins 112f are formed on the wall. The contact probe is detachably secured to the socket base 110.

Thus, in the case of the socket of the third embodiment, a general-purpose socket available in the market is used as its socket base 110. This configuration still makes it possible to enhance the heat dissipation from the socket and the contact probe.

Fourth Embodiment

Figure 14:
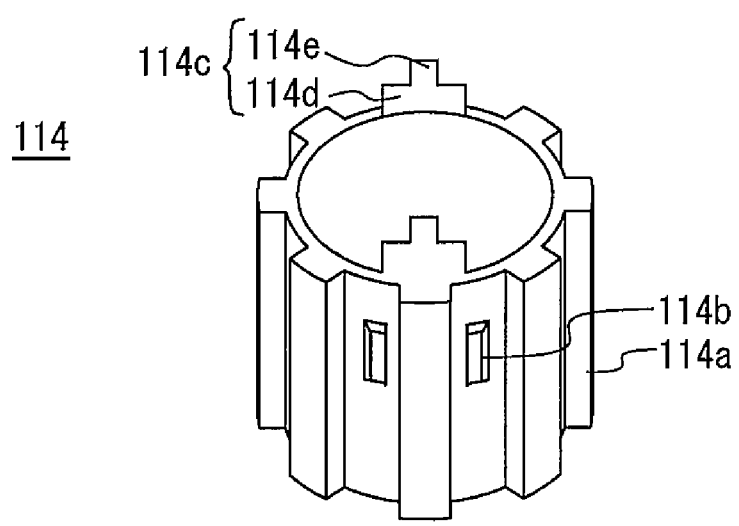
FIG. 14 is a perspective view of a socket of the fourth embodiment.

A fourth embodiment of the present invention provides an inspection apparatus which has many features common to the inspection apparatus of the first embodiment. Therefore, the following description of the fourth embodiment will be primarily limited to the differences from the first embodiment. FIG. 14 is a perspective view of a socket of the fourth embodiment.

The body portion 114a of this socket, 119, is formed of a metal material having a plurality of projections and recesses on its surface. That is, a plurality of alternating projections and recesses are formed on the surface of the body portion 114a of the socket 114. Through-holes 114b are formed in the wall of the socket 114. Connection portions 114c are connected to the body portion 114a of the socket 114. Thus, in the inspection apparatus of the fourth embodiment, the body portion 114a of the socket 114 is provided with projections and recesses on its surface, resulting in enhanced heat dissipation from the socket 114. It should be noted that knurling may be applied to the surface of the socket in order to increase the surface area of the socket.

It should be further noted that if it is possible to prevent the insulating substrate from being heated to a high temperature merely by forming projections and recesses on the surface of the socket, then the through-holes and the connection portions of the socket may be omitted. In that case, the body portion is secured directly to the insulating substrate.

Fifth Embodiment

Figure 15:
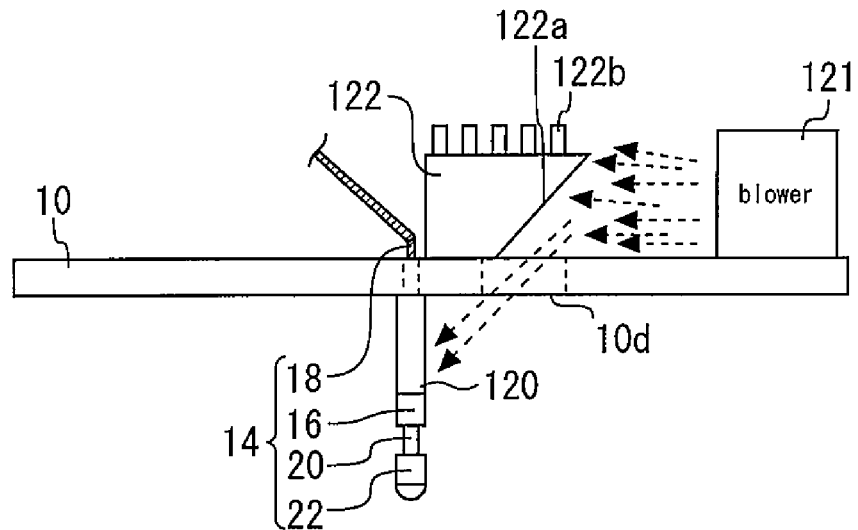
FIG. 15 is a diagram showing the inspection apparatus of the fifth embodiment.

A fifth embodiment of the present invention provides an inspection apparatus which has many features common to the inspection apparatus of the first embodiment. Therefore, the following description of the fifth embodiment will be primarily limited to the differences from the first embodiment. FIG. 15 is a diagram showing the inspection apparatus of the fifth embodiment.

An air blow through-hole 10d is formed in the insulating substrate 10. A socket 120 is secured to the lower surface of the insulating substrate 10. The contact probe 14 is detachably secured to the socket 120. A blower 121 is disposed on the upper surface side of the insulating substrate 10. The blower 121 is used to blow air onto the socket 120 and the contact probe 14 through the air blow through-hole 10d.

A radiator 122 is secured to the upper surface of the insulating substrate 10. The radiator 122 is preferably formed of aluminum or copper, both of which have excellent heat conductivity. The radiator 122 receives air from the blower 121 and directs this air into the air blow through-hole 10d. Specifically, the radiator 122 has a slope 122a formed therein, and the air blown by the blower 121 hits this slope and is directed into the air blow through-hole 10d. In addition to this air directing function, the radiator 122 has a function to discharge heat from the insulating substrate 10 to ambient atmosphere. The radiator 122 is also provided with radiating fins 122b in order to enhance its heat discharge function.

A method of using the inspection apparatus of the fifth embodiment will now be described. First, the blower 121 is caused to blow air toward the slope 122a of the radiator 122. As a result, the radiator 122 is cooled and the air from the blower 121 is directed into the air blow through-hole 10d. The air stream that has passed through the air blow through-hole 10d stirs and spreads the air around the socket 120 and the contact probe 14.

When the semiconductor device to be inspected is a power semiconductor device, a current of a few hundreds of amperes is sometimes applied to it by bring a plurality of contact probes into contact with a large connection pad on the semiconductor device. In such cases, the heat dissipation capability of the sockets described in connection with the first to fourth embodiments may not be sufficient to prevent the insulating substrate from being heated to a high temperature. Therefore, the inspection apparatus of the fifth embodiment is configured in such a manner that the radiator 122 is disposed on the insulating substrate 10 so as to discharge heat from the insulating substrate 10 to the atmosphere through the radiator 122. In addition, air is blown onto the radiator 122 by the blower 121 so as to dissipate heat from the radiator 122 and from the components around the radiator 122. Further, the air steam from the blower 121 is directed to the socket 120 and the contact probe 14 and the immediate surroundings thereof, thereby discharging heat from the socket 120 and the contact probe 14 to ambient atmosphere and preventing the insulating substrate 10 from being heated to a high temperature.

Figure 16:
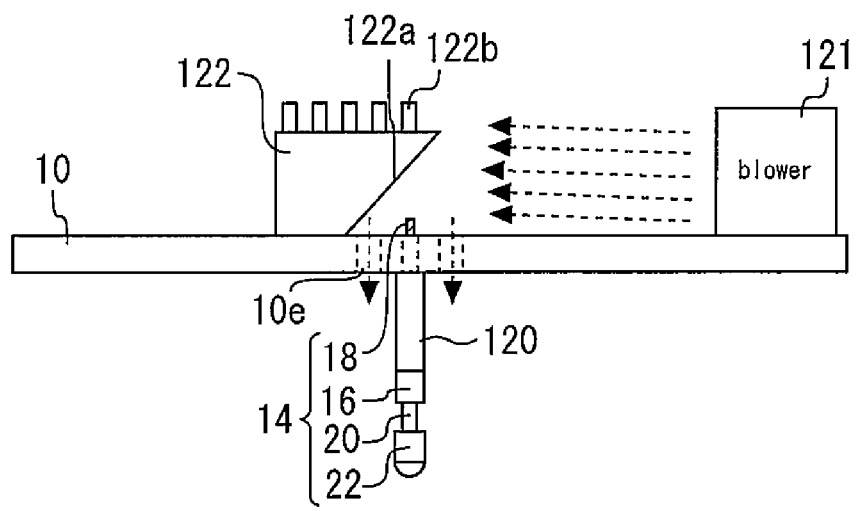
FIG. 16 is a variation of the inspection apparatus of the fifth embodiment.

FIG. 16 is a variation of the inspection apparatus of the fifth embodiment. In this inspection apparatus, the insulating substrate 10 has two air blow through-holes 10e formed to sandwich the socket 120 therebetween. Further, the radiator 122 is secured to the insulating substrate 10 and positioned such that the air from the blower 121 is directed into the air blow through-holes 10e. With this arrangement, an air stream can be supplied from substantially directly above the socket 120 and the contact probe 14 so that the air stream is not blocked by the socket 120 and the contact probe 14, resulting in improved heat dissipation from the insulating substrate 10.

The fifth embodiment does not necessarily require a radiator. That is, the air from the blower 121 may be directed toward the air blow through-holes without use of the radiator 122. Further, the blower 121 need not necessarily be secured to the upper surface of the insulating substrate 10 if air can be blown into the air blow through-hole from above the insulating substrate 10.

The radiator 122 may be formed of porous metal material in order to increase the surface area of the radiator 122 and thereby enhance its heat-radiating capability. A porous metal material may be produced, e.g., by forming shrinkage cavities in a metal material in the casting process.

Various alterations may be made to all the embodiments described above without departing from the scope of the present invention. For example, features of different embodiments described above may be combined where appropriate.

The present invention makes it possible to easily prevent the expansion and warpage of the insulating substrate.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2012-154699, filed on Jul. 10, 2012 including specification, claims, drawings and summary, on which the Convention priority of the present application is based, are incorporated herein by reference in its entirety.

What is claimed is:

1. An inspection apparatus comprising:
    an insulating substrate;
    a cylindrically-shaped hollow socket that includes a top, a bottom and a body portion in which the body portion includes a through-hole in a side wall thereof, the socket being integrally formed with a connection portion at the top of the socket secured to said insulating substrate; and
    an elongated and electrically-conductive contact probe detachably secured to said a socket at the bottom of the socket, wherein the through-hole is configured to enhance heat dissipation of the socket and the contact probe.

2. The inspection apparatus according to claim 1, wherein said connection portion is secured to said insulating substrate in such a manner that an air gap is formed between said body portion and said insulating substrate.

3. The inspection apparatus according to claim 1, wherein a portion of said contact probe is exposed to ambient atmosphere through said through-hole.

4. The inspection apparatus according to claim 1, wherein the portion of said contact probe which is brought into contact with an object to be measured is rounded.

5. The inspection apparatus according to claim 1, wherein said socket is provided with a radiating fin.

6. The inspection apparatus according to claim 5, wherein said radiating fin is formed by bending a portion of said socket.

7. The inspection apparatus according to claim 1, wherein:
    said socket has a socket base;
    said socket includes a mounting member secured to said socket base, said mounting member having said body portion and said connection portion; and
    said contact probe is detachably secured to said socket base.

8. The inspection apparatus according to claim 1, wherein said socket is formed of a metal material having a plurality of projections and recesses on a surface thereof.

9. The inspection apparatus according to claim 1, wherein a heat dissipation through-hole is formed in said insulating substrate.

10. The inspection apparatus according to claim 1, wherein:
    a securing through-hole is formed in said insulating substrate; and
    said connection portion is inserted through said securing through-hole and secured to said insulating substrate.

11. An inspection apparatus comprising:
    an insulating substrate having at least one air blow through-hole formed therein;
    a socket secured to a lower surface of said insulating substrate;
    a contact probe detachably secured to said socket; and
    a blower disposed on the upper side of said insulating substrate and adapted to blow air onto said socket and said contact probe through said at least one air blow through-hole.

12. The inspection apparatus according to claim 11, wherein said insulating substrate has two said air blow through-holes formed to sandwich said socket therebetween.

13. The inspection apparatus according to claim 11, further comprising a radiator secured to an upper surface of said insulating substrate and adapted to receive air from said blower and direct said air into said at least one air blow through-hole.

14. The inspection apparatus according to claim 13, wherein said radiator is formed of porous metal material.

15. The inspection apparatus according to claim 11, wherein the blower is adapted to blow air onto said socket and said contact probe downward through said at least one air blow through-hole.

16. The inspection apparatus according to claim 1, wherein the body portion includes a plurality of through-holes in a side wall thereof.

* * * * *